United States Patent
Petenyi

(10) Patent No.: US 10,295,577 B1
(45) Date of Patent: *May 21, 2019

(54) CURRENT SENSOR WITH EXTENDED VOLTAGE RANGE

(71) Applicant: STMicroelectronics Design & Application S.R.O., Prague (CZ)

(72) Inventor: Sandor Petenyi, Lysa nad Labem (CZ)

(73) Assignee: STMicroelectronics Design & Application S.R.O., Prague (CZ)

( * ) Notice: Subject to any disclaimer, the term of this patent is extended or adjusted under 35 U.S.C. 154(b) by 0 days.

This patent is subject to a terminal disclaimer.

(21) Appl. No.: 16/202,864

(22) Filed: Nov. 28, 2018

Related U.S. Application Data

(63) Continuation of application No. 15/920,896, filed on Mar. 14, 2018, now Pat. No. 10,168,363.

(51) Int. Cl.
| | |
|---|---|
| H02M 3/158 | (2006.01) |
| G01R 19/00 | (2006.01) |
| G05F 1/575 | (2006.01) |
| G05F 1/56 | (2006.01) |
| H02H 1/00 | (2006.01) |
| H02H 9/02 | (2006.01) |
| H02M 3/156 | (2006.01) |
| H02M 1/00 | (2006.01) |

(52) U.S. Cl.
CPC ......... *G01R 19/0092* (2013.01); *G05F 1/561* (2013.01); *G05F 1/575* (2013.01); *H02H 1/0007* (2013.01); *H02H 9/025* (2013.01); *H02M 3/156* (2013.01); *H02M 3/158* (2013.01); *H02M 3/1588* (2013.01); *H02M 2001/0009* (2013.01)

(58) Field of Classification Search
CPC .... H02M 3/156; H02M 3/158; H02M 3/1588; H02M 2001/0009
See application file for complete search history.

(56) References Cited

U.S. PATENT DOCUMENTS

| | | |
|---|---|---|
| 5,642,037 A | 6/1997 | Malherbe |
| 5,952,946 A | 9/1999 | Kramer et al. |
| 2011/0187344 A1 | 8/2011 | Iacob et al. |

OTHER PUBLICATIONS

Pandya, K, AND8093/D, "Current Sensing Power MOSFETs", ON Semiconductor, Semiconductors Components Industries, LLC, 2002, Mar. 2017—Rev. 6, 12 pages.
ST Life.Augmented, STEFO5D, "Electronic Fuse for 5 V line", DocID024394 Rev 1, Mar. 19, 2013, 19 pages.

*Primary Examiner* — Matthew V Nguyen
*Assistant Examiner* — Ishrat F Jamali
(74) *Attorney, Agent, or Firm* — Slater Matsil, LLP

(57) ABSTRACT

In an embodiment, a current sense circuit includes a copy transistor having a gate configured to be coupled to a gate of an output transistor, and a drain coupled to an input terminal. The drain of the copy transistor is configured to be coupled to a drain of the output transistor. A first transistor has a current path coupled to a current path of the copy transistor. An error amplifier has a non-inverting input coupled to a source of the copy transistor, an inverting input configured to be coupled to a source of the output transistor, an output coupled to a gate of the first transistor, a positive power supply terminal coupled to the input terminal and a negative power supply terminal coupled to a reference supply terminal. A current-to-voltage converter has an input coupled to the current path of the copy transistor.

22 Claims, 6 Drawing Sheets

CURRENT SENSOR WITH EXTENDED VOLTAGE RANGE

CROSS-REFERENCE TO RELATED APPLICATIONS

This application is a continuation of U.S. patent application Ser. No. 15/920,896, filed on Mar. 14, 2018, which application is hereby incorporated herein by reference.

TECHNICAL FIELD

The present invention relates generally to an electronic system, and, in particular embodiments, to a current sensor with extended voltage range.

BACKGROUND

Some electronic circuits, such as power supplies or power metal-oxide-semiconductor field-effect transistor (MOSFET) circuits include a current sensor circuit. The current sensor circuit may be used, for example, to sense a current flowing through a load and to trigger an overcurrent protection circuit when the load current is above a predetermined threshold. For example, an electronic fuse (e-fuse) is an active circuit that may rely on a current sensor circuit to provide over-current protection.

Some circuits may use a current sensor circuit to regulate a current. For example, in a light-emitting diode (LED) driver, a current sensor circuit may be used to monitor a current going through a LED and produced a feedback signal based on the sensed current. A controller may use the feedback signal produced by the current sensor circuit to regulate the current flowing through the load to achieve, for example, a constant current.

Some circuits may have operating conditions with a wide range of power supply voltages. For example, although the typical operating voltage in a car battery is 12 V, variations between 9V and 16 V are expected during normal operation. During a cold cranking condition, the voltage of the battery of a car may drop to a voltage lower than 5 V. It is common, therefore, for devices designed for the automotive industry to support operating voltages lower than 5 V as well as higher than 18 V. A current sensor circuit with operating conditions with a wide voltage range is expected to accurately sense the current through the wide voltage range.

SUMMARY

In accordance with an embodiment, a current sense circuit includes: a copy transistor of a first type having a gate terminal configured to be coupled to a gate terminal of an output transistor of the first type, and a drain terminal coupled to an input terminal, the drain terminal of the copy transistor configured to be coupled to a drain terminal of the output transistor; a first transistor of the first type having a current path coupled to a current path of the copy transistor; an error amplifier having a non-inverting input terminal coupled to a source terminal of the copy transistor, an inverting input terminal configured to be coupled to a source terminal of the output transistor, an output terminal coupled to a gate terminal of the first transistor, a positive power supply terminal coupled to the input terminal and a negative power supply terminal coupled to a reference supply terminal; and a current-to-voltage converter having an input coupled to the current path of the copy transistor.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The description below illustrates the various specific details to provide an in-depth understanding of several example embodiments according to the description. The embodiments may be obtained without one or more of the specific details, or with other methods, components, materials and the like. In other cases, known structures, materials or operations are not shown or described in detail so as not to obscure the different aspects of the embodiments. References to "an embodiment" in this description indicate that a particular configuration, structure or feature described in relation to the embodiment is included in at least one embodiment. Consequently, phrases such as "in one embodiment" that may appear at different points of the present description do not necessarily refer exactly to the same embodiment. Furthermore, specific formations, structures or features may be combined in any appropriate manner in one or more embodiments.

The present invention will be described with respect to embodiments in a specific context, a current sensor circuit with extended voltage range for use in various systems, such as an e-fuse system. Embodiments of the present invention may be used in other types of circuits, such as, for example, in power supplies, power management integrated circuits (PMICs), battery charges, and LED drivers, as well as in other circuits that may benefit from current sensing. For example, embodiments may be implemented in applications for protecting a programmable logic controller (PLC) or other system board.

Figure 1A:
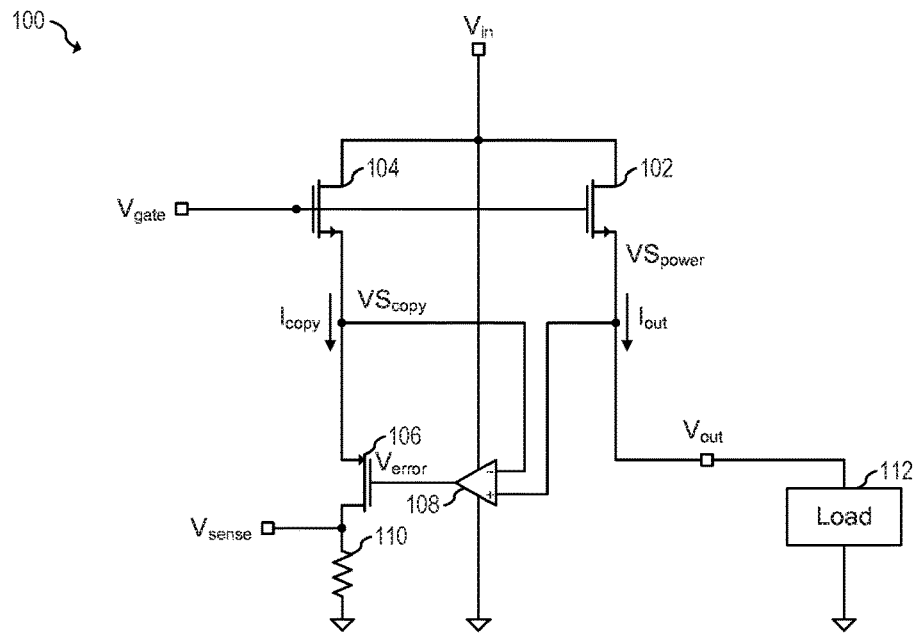
FIG. 1A shows an exemplary current sensor circuit for a load driven by a power MOSFET.

A power MOSFET for driving a load may use a current sensor circuit for overcurrent protection and/or for load current regulation. FIG. 1A shows exemplary current sensor circuit 100 for load 112 driven by power MOSFET 102. Current sensor circuit 100 includes NMOS transistor 104, PMOS transistor 106, resistor 110, and error amplifier 108 having an inverting input connected to a source of NMOS transistor 104 and a non-inverting input connected to a source of power MOSFET 102. A gate of power MOSFET 102 is driven by a gate driver (not shown), which is typically controlled by a controller (not shown).

During normal operation, current sensor circuit 100 senses output current $I_{out}$, generates current $I_{copy}$ based on output current $I_{out}$, and produces sensed voltage $V_{sense}$ based on current $I_{copy}$. Current $I_{copy}$ is a copy of output current $I_{out}$ scaled based on the sizing ratio between transistors 104 and 102.

To generate current $I_{copy}$, the gates, sources and drains of transistors 102 and 104 are kept with the same voltage. As shown in FIG. 1A, the gates of transistors 202 and 204 are connected to the same node $V_{gate}$ and the drains of transistors 102 and 104 are connected to the same node $V_{in}$. The sources of transistors 102 and 104 are kept to the same voltage by using error amplifier 108 and PMOS transistor 106. Error amplifier 108 controls a gate of PMOS transistor 106 to keep the voltage of node $VS_{copy}$ equal to the voltage of node $VS_{power}$. For example, when $VS_{power}$ is higher than $VS_{copy}$, the output of error amplifier 108 ($V_{error}$) increases, which increases the on-resistance of PMOS transistor 106, which in turn increases the voltage of $VS_{copy}$. When $VS_{power}$ is lower than $VS_{copy}$, the output of error amplifier 108 ($V_{error}$) decreases, which decreases the on-resistance of PMOS transistor 106, which in turn decreases the voltage of $VS_{copy}$.

Figure 1B:
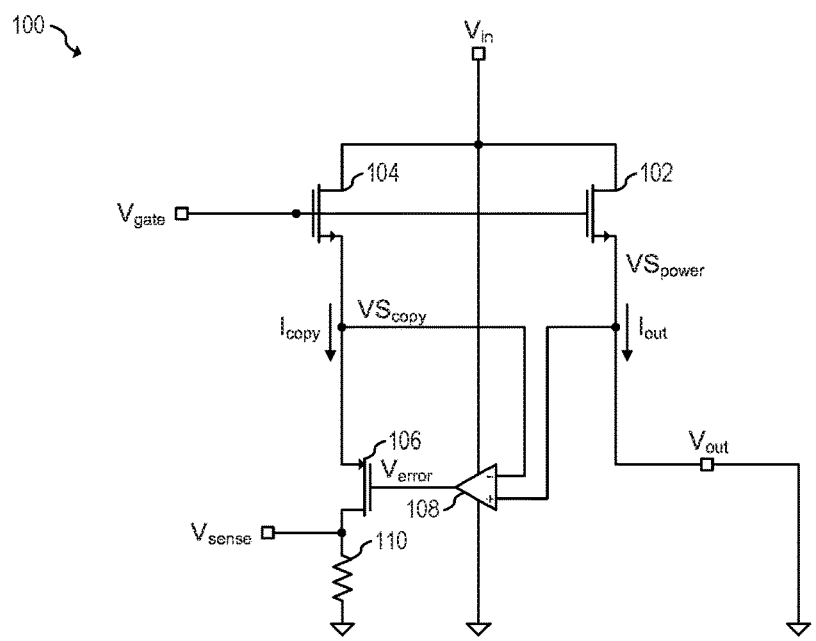
FIG. 1B shows the circuit of FIG. 1A with the load shorted to ground.

During a short-circuit condition (i.e., load 112 shorted to ground), node $VS_{copy}$ may not track node $VS_{power}$. FIG. 1B shows exemplary current sensor circuit 100 with load 112 shorted to ground.

As shown in FIG. 1B, during a short-circuit condition, node $VS_{power}$ may be very low (e.g., about 0V). As a result, the output of error amplifier 108 ($V_{error}$) is reduced to decrease the on-resistance of PMOS transistor 106 and reduce the voltage of node $VS_{copy}$. However, as shown in FIG. 1B, error amplifier 108 has a positive power supply terminal connected to input node $V_{in}$ (e.g., 12 V) and a negative power supply terminal connected to ground. Therefore, the node $V_{error}$ may not get below ground. As a result, node $VS_{copy}$ may stay at about one $V_{gs}$ voltage above node $V_{error}$ (e.g., 0.7 V). Since $VS_{copy}$ is different than $VS_{power}$, current $I_{copy}$ may not track output current $I_{out}$.

The circuit of FIGS. 1A and 1B may be modified to include a negative charge-pump to provide a sufficiently negative voltage to the negative power supply terminal of error amplifier 108 to allow current $I_{copy}$ to track output current $I_{out}$ when output $V_{out}$ is low, such as during a short-circuit condition.

Current sensor circuit 100 generates voltage $V_{sense}$ by flowing current $I_{copy}$ through resistor 110. When current $I_{copy}$ is high, the voltage drop developed across resistor 110 raises the voltage at the drain terminal of transistor 106. By increasing the voltage at the drain terminal of transistor 106, the possible swing $VS_{copy}$ may be reduced.

In an embodiment of the present invention, an output current flowing through an n-type power MOSFET in a common drain configuration is accurately sensed at the source terminal of the n-type power MOSFET when the voltage at the source terminal of the n-type power MOSFET is low. Accurate current sensing is achieved without using a negative charge-pump circuit, thereby reducing complexity of the system.

Figure 2A:
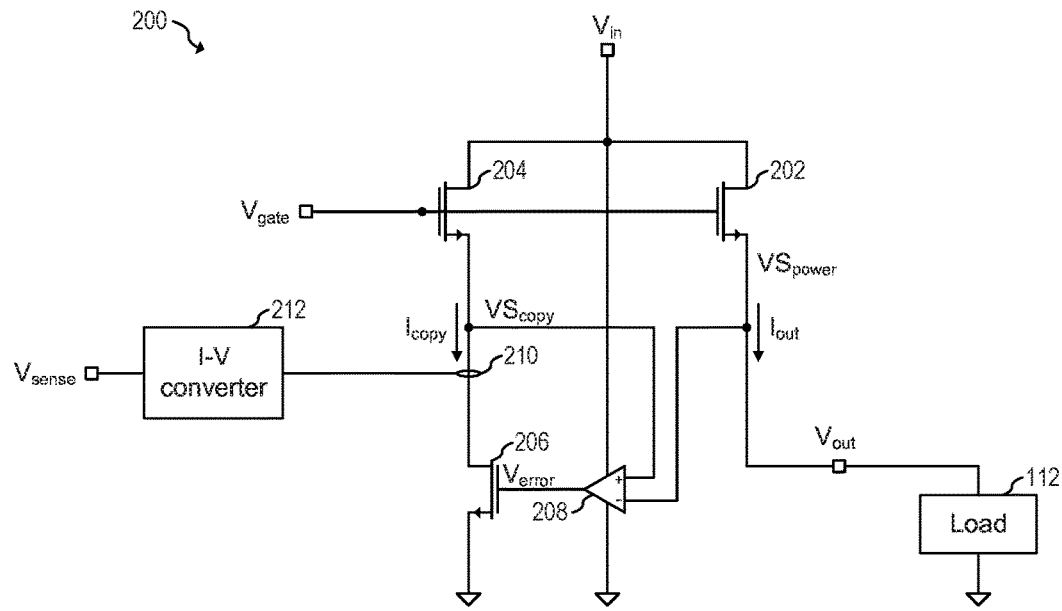
FIG. 2A shows a current sensor circuit for a load driven by power MOSFET 202, according to an embodiment of the present invention.

FIG. 2A shows current sensor circuit 200 for load 112 driven by power MOSFET 202, according to an embodiment of the present invention. Current sensor circuit 200 includes NMOS transistors 204 and 206, current-to-voltage (I-V) converter 212, and error amplifier 208 having a non-inverting input connected to a source of NMOS transistor 204 and an inverting input connected to a source of power MOSFET 202. NMOS transistor 204 may also be referred to as the copy MOSFET transistor.

During normal operation, current sensor circuit 200 senses output current $I_{out}$, generates current $I_{copy}$ based on output current $I_{out}$, and produces sensed voltage $V_{sense}$ based on current $I_{copy}$. Current $I_{copy}$ is a copy of output current $I_{out}$ scaled based on the sizing ratio between transistors 204 and 202.

To generate current $I_{copy}$, the gates, sources and drains of transistors 202 and 204 are kept with the same voltage. As shown in FIG. 2A, the gates of transistors 202 and 204 are connected to the same node $V_{gate}$ and the drains of transistors 202 and 204 are connected to the same node $V_{in}$. The sources of transistors 202 and 204 are kept to the same voltage by using error amplifier 208 and NMOS transistor 206. Error amplifier 208 controls a gate of NMOS transistor 206 to keep the voltage of node $VS_{copy}$ equal to the voltage of node $VS_{power}$. For example, when $VS_{power}$ is higher than $VS_{copy}$, the output of error amplifier 208 ($V_{error}$) decreases, which increases the on-resistance of NMOS transistor 206, which in turn increases the voltage of $VS_{copy}$.

Figure 2B:
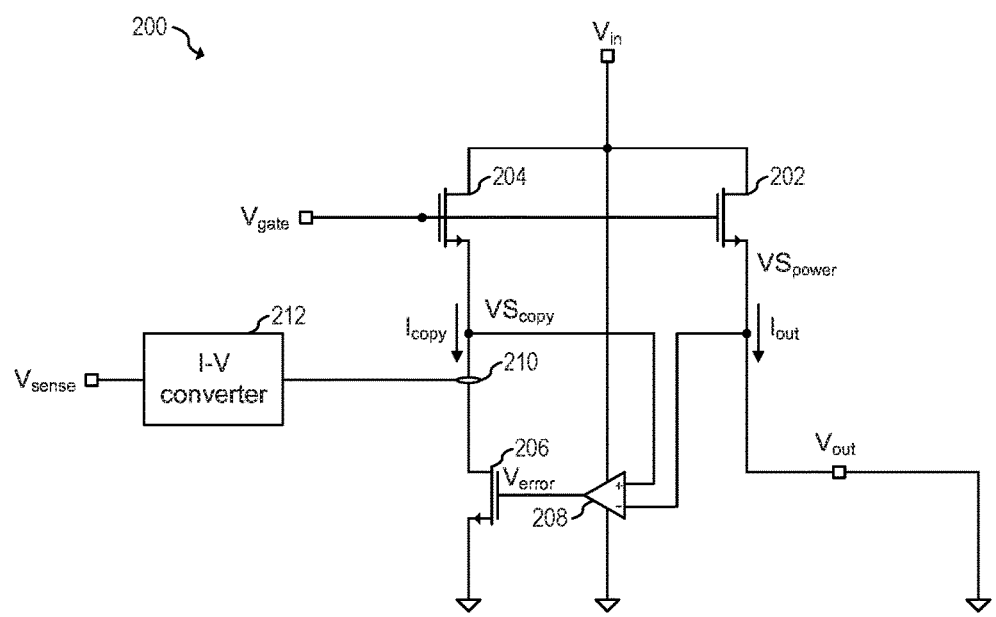
FIG. 2B shows the circuit of FIG. 2A with the load shorted to ground, according to an embodiment of the present invention.

When $VS_{power}$ is lower than $VS_{copy}$, the output of error amplifier 208 ($V_{error}$) increases, which decreases the on-resistance of NMOS transistor 206, which in turn decreases the voltage of $VS_{copy}$. When $VS_{power}$ is very low (e.g., close to 0 V), the output of error amplifier 208 ($V_{error}$) is pulled up (e.g., up to the voltage at input node $V_{in}$), which fully turns on NMOS transistors 206 and causes $VS_{copy}$ to drop to about 0 V, depending on the on-resistance of NMOS transistors 206. For example, FIG. 2B shows current sensor circuit 200 with load 112 shorted to ground, according to an embodiment of the present invention. As shown in FIG. 2B, when the voltage at node $VS_{power}$ is 0 V, current $I_{copy}$ accurately tracks output current $I_{out}$.

Load 112 may be, for example, an LED. Other loads, such as a DC motor, solenoid, resistive load, or others may be used. Load 112 may also be whole systems, such as a computer server, peripherals such as hard drives, and devices and systems with hot swap capabilities. Load 112 also be, for example, a motor for driving a window in a car, or a servo drive of an air inlet valve of a car. Other loads may be used.

Error amplifier 208 may be implemented in any way known in the art. For example, error amplifier 208 may be implemented with an op-amp implementation. For example, error amplifier 208 may be implemented using an operation amplifier that uses a chopped technique to achieve low offset without trimming. In some embodiments, the error amplifier is implemented with an operational amplifier with rail-to-rail input common mode voltage range.

Some embodiments may implement the circuit of FIGS. 2A and 2B with transistors other than MOSFET transistors. For example, some embodiments may use bipolar junction transistors (BJTs), or insulated gate bipolar transistors (IGBTs). Other transistor technologies may also be used. As shown in FIGS. 2A and 2B, transistors 202, 204 and 206 are implemented with n-type transistors. Some embodiments may instead use p-type transistors. The selection of which transistor to use may be made according to the specifications and voltage levels of the particular power converter being designed and appropriate adjustments to the circuit may be made to accommodate the particular device type.

In some embodiments, transistors 204 and 206, error amplifier 208 and I-V converter 212 are integrated into a single monolithic semiconductor substrate while power transistor 202 may be implemented discretely (i.e., external to the integrated circuit). In other embodiments, power transistor 202 may be integrated with transistors 204, 206, error amplifier 208 and I-V converter 212. In yet other embodiments, each of transistors 202, 204, 206, error amplifier 208 and i-V converter 212 may be implemented discretely. Other implementations are also possible.

In some embodiments, transistor 206 has a relatively high W/L ratio such that the minimum $V_{ds}$ of transistor 206 is only a few millivolts, even when current $I_{copy}$ is at its maximum. For example, in some embodiments, the W/L ratio of transistor 206 is 1 m/1 u, which causes a maximum $V_{ds}$ of 30 mV when current $I_{copy}$ is at a maximum of 500 uA. Other W/L ratios are also possible.

Advantages of some embodiments include the increase in the voltage range in which the error amplifier is able to replicate the source voltage of the power MOSFET to the source of the copy MOSFET transistor. Accurate current sensing of an output current flowing through a current path of an n-type power MOSFET in common drain configuration over a wide voltage range is thus possible. This is particularly advantageous for some MOSFET technologies (e.g., some vertical MOSFET technologies) in which the drain of the MOSFETs is formed by the chip backside (substrate), which prevents the possibility of separating drain terminals of the power MOSFET and copy MOSFET. In some embodiments, accurate current sensing is achieved without using a negative charge-pump circuit, thereby reducing complexity of the system.

Additional advantages include that by avoiding the use of a resistor through which the copy current flows to generate voltage $V_{sense}$, the possible voltage swing of node $VS_{copy}$ is not reduced as a result of the magnitude of the copy current.

Figure 3:
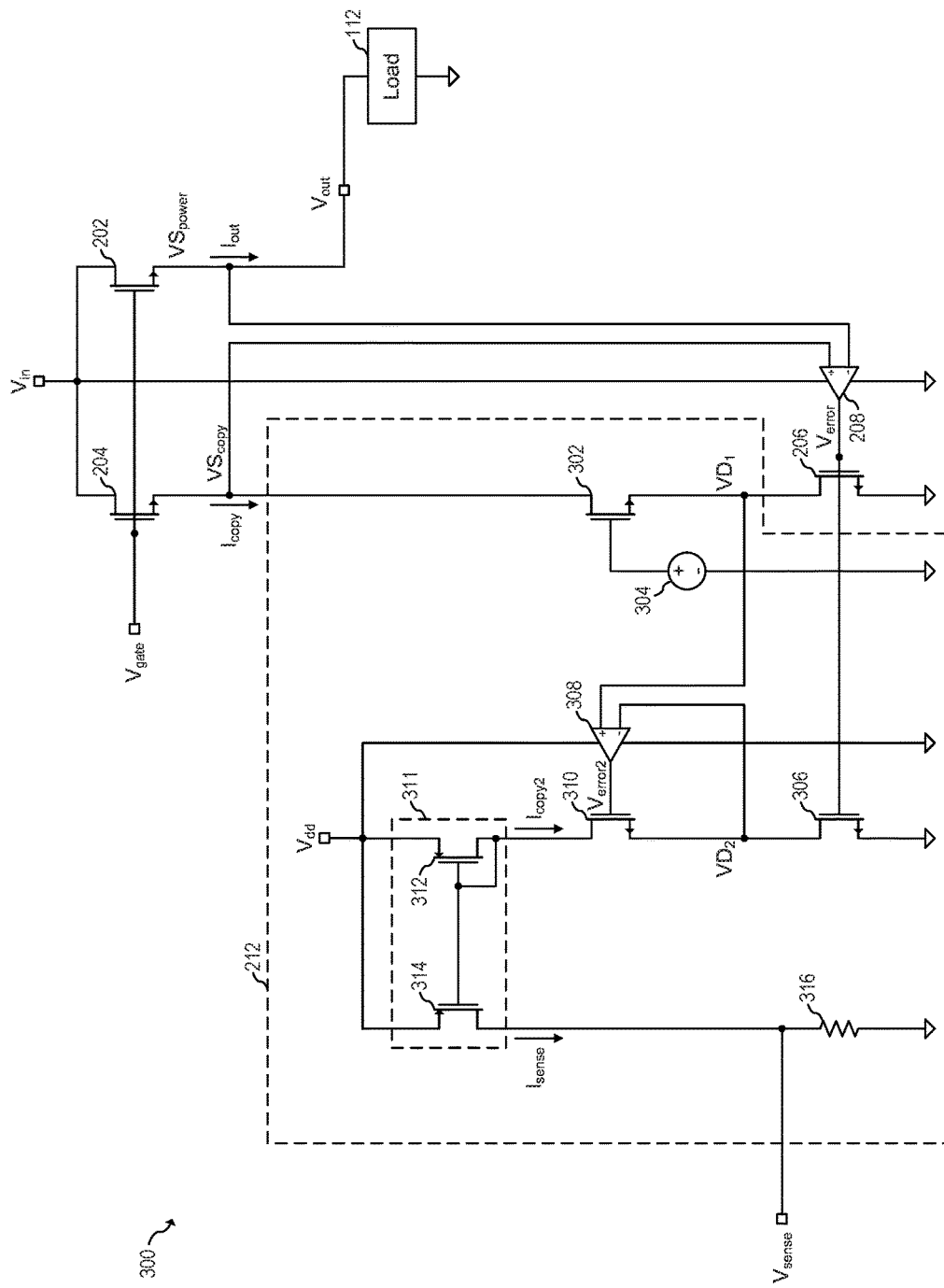
FIG. 3 shows a current sensor circuit for a load driven by a power MOSFET, according to an embodiment of the present invention.

FIG. 3 shows current sensor circuit 300 for load 112 driven by power MOSFET 202, according to an embodiment of the present invention. Current sensor circuit 300 operates in a similar manner as current sensor circuit 200 and includes a particular implementation of I-V converter 212.

As shown in FIG. 3, I-V converter 212 may include NMOS transistors 302, 306, and 310, PMOS transistors 312 and 314, resistor 316, voltage generator 304, and error amplifier 308. Other I-V converter implementations may be possible.

During normal operation, cascode transistor 302 is kept on by voltage generator 304. Current $I_{copy}$ is generated in a similar manner as described with respect to current sensor circuit 200.

As shown in FIG. 3, the output of error amplifier 208 is connected to the gates of transistors 206 and 306. By keeping the voltage of the drain of transistor 306 ($VD_2$) equal to the voltage of the drain of transistor 206 ($VD_1$), current $I_{copy}$ is replicated into current $I_{copy2}$ scaled based on the ratio between transistors 206 and 306. The voltage at node $VD_2$ is kept equal to the voltage at node $VD_1$ by using error amplifier 308 and transistor 310, as shown in FIG. 3. Error amplifier 308 advantageously keeps voltage VD1 equal to voltage VD2 regardless of whether transistor 206 is operated in saturation mode (i.e., when $V_{gd} < V_{th}$), or in linear mode (i.e., when $V_{gd} > V_{th}$).

Current $I_{copy2}$ is mirrored into current $I_{sense}$ by a current mirror 311. Voltage $V_{sense}$ is generated by flowing current $I_{sense}$ through resistor 316.

Error amplifier 308 may be implemented in any way known in the art. For example, error amplifier 308 may be implemented with an op-amp implementation. For example, error amplifier 208 may be implemented using an operation amplifier that uses a chopped technique to achieve low offset without trimming. In some embodiments, the error amplifier is implemented with an operational amplifier with rail-to-rail input common mode voltage range.

Voltage generator 304 may be implemented in any way known in the art. For example, voltage generator 304 may be implemented with a bandgap reference, a resistor divider, using the forward voltage of, e.g., two diodes. Voltage generator 304 may also be implemented with a voltage regulator such as an LDO having as input voltage $V_{dd}$. Other implementations are also possible. As a non-limiting example, voltage generator 304 may generate 1.2 V using a resistor divider.

Input node $V_{dd}$ typically receives a lower voltage (e.g., 1.8 V, 3.3 V or 5 V) than input node $V_{in}$, which typically receives a voltage of 12 V. Other voltages may be used.

In some embodiments, node $VD_1$ is kept at around 0.5 V by virtue of the cascode configuration (e.g., voltage generator 304 may produce, e.g., 1.2 V and $V_{gs}$ of transistor 302 may be, e.g., 700 mV). Therefore, transistor 206 is not exposed to the high voltages of input node $V_{in}$. Some embodiments may implement transistors 206, 306, 310, 312, and 314, and the transistors of error amplifier 308 with low-voltage transistors, such as 3 V transistors, while implementing transistors 202, 204, and 302 with high-voltage transistors, such as 16 V transistors. Low-voltage transistor may be transistor other than 3 V transistors. For example, low-voltage transistors may be 5 V transistors. High-voltage transistors may be transistors other than 16 V transistors. For example, high-voltage transistors may be 12 V transistors, 20 V transistors, 100 V transistors or higher.

Advantages of some embodiments include that by using low-voltage transistors for transistors 206, 306, 310, 312, and 314, and the transistors of error amplifier 308, the area occupied by current sensor circuit 300 may be reduced when compared to using high-voltage devices. Other advantages include the copying of current $I_{copy}$ without reducing the swing range of node $VS_{copy}$ (e.g., since no resistor is used in series with transistor 206).

Figure 4:
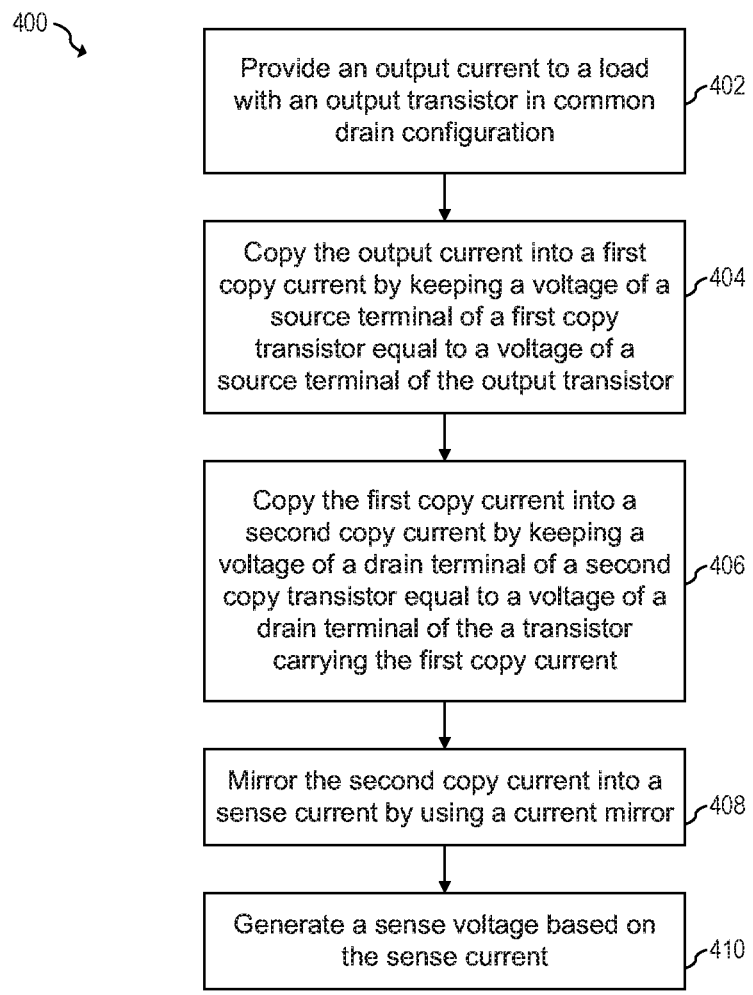
FIG. 4 illustrates a flow chart of an embodiment method for current sensing of an output current of a transistor in current drain configuration, according to an embodiment of the present invention.

FIG. 4 illustrates a flow chart of embodiment method 400 for current sensing of an output current of a transistor in current drain configuration, according to an embodiment of the present invention. Method 400 may be implemented current sensor circuit 300. Method 400 may also be implemented in other circuit architectures and in other ways known in the art. The discussion that follows assumes that current sensor circuit 300, as shown in FIG. 3, implements method 400 of current sensing.

During step 402, an output transistor in common-drain configuration, such as power MOSFET 202, provides an output current to a load, such as load 112. During step 404, the output current is copied into a first copy current by keeping a voltage of a source terminal of a first copy transistor (e.g., transistor 204) equal to a voltage of a source terminal of the output transistor. In some embodiments, an error amplifier (e.g., error amplifier 208) may be used to keep the drain terminals of the first copy transistor and the output transistor equal.

During step 406, the first copy current is copied into a second copy current by keeping a voltage of a drain terminal of a second copy transistor (e.g., transistor 306) equal to a voltage of a drain terminal of a transistor carrying the first copy current (e.g., transistor 206). In some embodiments, an error amplifier (e.g., error amplifier 308) may be used to keep the drain terminals of the first copy transistor and the transistor carrying the first copy current equal.

During step 408, the second copy current is mirrored into a sense current using a current mirror (e.g., current mirror 311). During step 410, a sense voltage is generated based on the second copy current. In some embodiments, the sense voltage is generated by flow through the second copy current through a resistor (e.g., 316).

Figure 5:
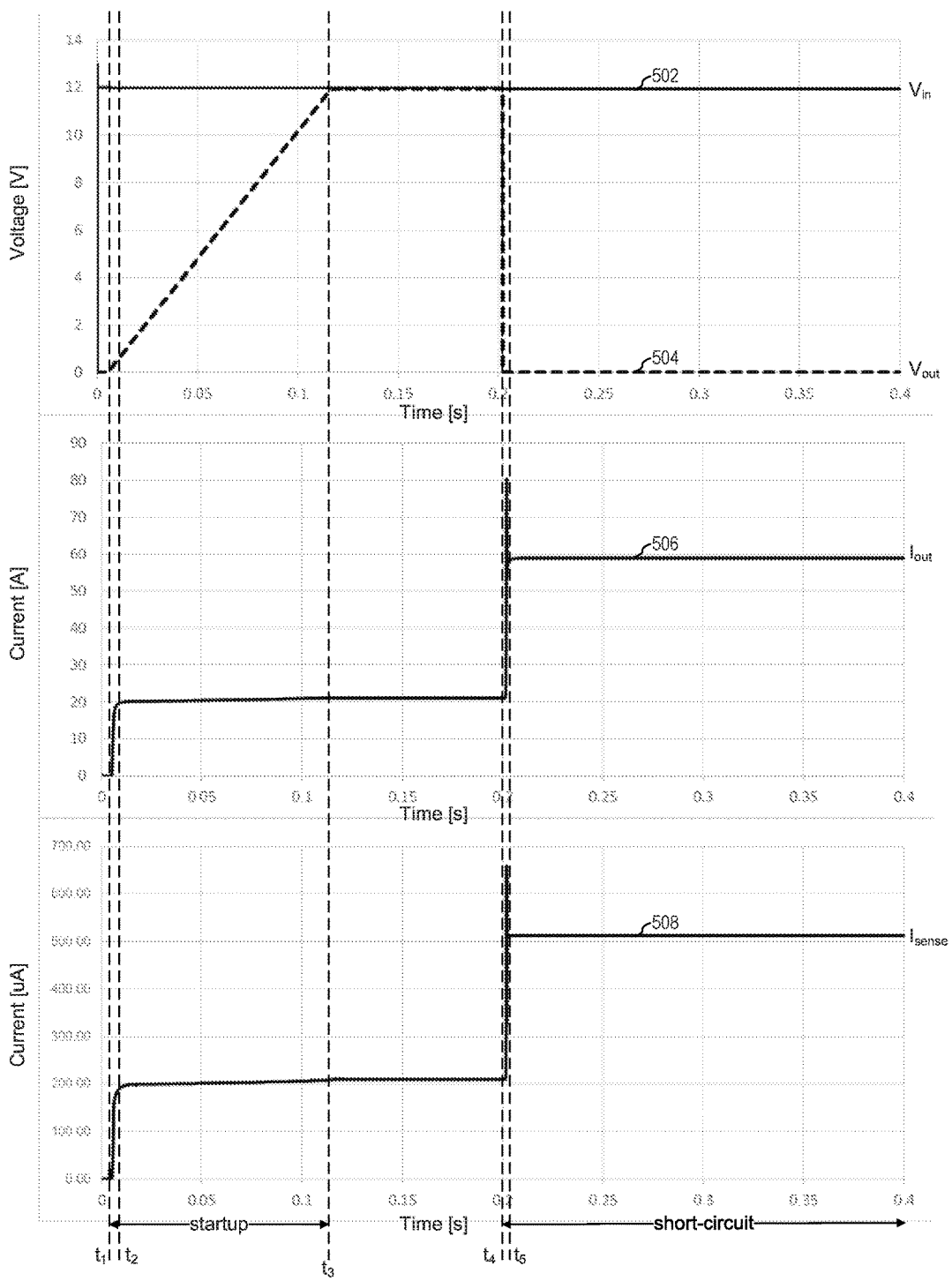
FIG. 5 shows simulation of data of the current sensor circuit of FIG. 3 during startup and short-circuit conditions, according to an embodiment of the present invention.

FIG. 5 shows simulation of data of current sensor circuit 300 during startup and short-circuit conditions, according to an embodiment of the present invention. The simulation data was performed in an e-fuse circuit (not shown) that, in addition to current sensor circuit 300, includes a soft-start circuit (not shown) and an over-current protection circuit (not shown). The sensitivity of the current sensor circuit simulated and illustrated in FIG. 5 is 10 uA/A.

At time $t_0$ (i.e., 0 ms), the input voltage $V_{in}$ ramps up from 0 V to 12 V, as shown by curve 502. Output voltage $V_{out}$ begins increasing at time t1 until settling at 12 V at time $t_3$, as shown by curve 504. From time $t_1$ until time $t_2$, the soft-start circuit operates by limiting the output current, as shown by curve 506. As shown by curves 506 and 508, current $I_{sense}$ accurately tracks output current $I_{out}$, even at very low voltages (e.g., during startup). The maximum error obtained from time $t_0$ to time $t_4$ between the ideal current $I_{sense}$ and the simulated current $I_{sense}$ was 2.47%.

At time t4, load 112 is shorted to ground. As a result, output voltage drops to 0 V, and output current spikes to over 80 A, as shown by curves 504 and 506. Once the over-current protection is activated at time $t_5$, output current is clamped at about 58.8 A, as shown by curve 506. As shown by curves 506 and 508, current $I_{sense}$ accurately tracks output current $I_{out}$, even during a short-circuit condition. Although difficult to see in FIG. 5, the simulation data shows that current sensor 300 is able to provide accurate sensed current when $V_{out}$ is as low as 15 mV. The maximum error obtained from time $t_0$ to the end of the simulation between the ideal current $I_{sense}$ and the simulated current $I_{sense}$ was about 13%.

Figure 6:
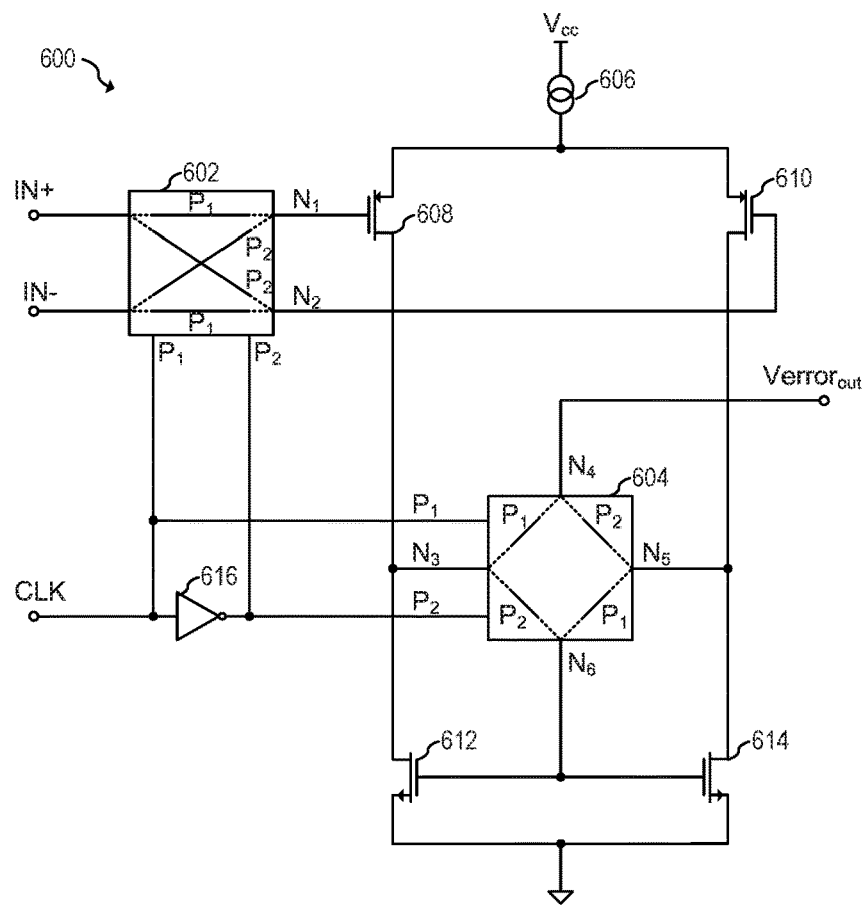
FIG. 6 shows a possible error amplifier implementation, according to an embodiment of the present invention.

FIG. 6 shows error amplifier 600, according to an embodiment of the present invention. Either error amplifier 208, or 308, or both, may be implemented as error amplifier 600. Error amplifier 600 includes positive input IN+, negative input IN−, output Verror$_{out}$, clock input CLK, supply terminal $V_{cc}$, switches 602 and 604, current generator 606, transistors 608, 610, 612, and 614, and inverter 616.

During normal operation, error amplifier implements the chopping technique by using switches 602 and 604 to connect nodes IN+ to $N_1$, IN− to $N_2$, $N_3$ to $N_4$ and $N_5$ to $N_6$, respectively, during the first period of the clock signal CLK (see signal $P_1$), and by using switches 602 and 604 to connect nodes IN+ to $N_2$, IN− to $N_1$, $N_3$ to $N_6$ and $N_5$ to $N_4$, respectively, during the second period of the clock signal CLK (see signal $P_2$).

Supply terminal $V_{cc}$ may be connected to any suitable power supply. For example, if error amplifier 208 is implemented with error amplifier 600, then, supply terminal $V_{cc}$ may be coupled to input node $V_{in}$ of FIG. 3. As another example, if error amplifier 308 is implemented with error amplifier 600, then, supply terminal $V_{cc}$ may be coupled to input node $V_{dd}$ of FIG. 3.

In some embodiments, the clock signal may have a frequency of about 100 kHz, or more. Other frequencies may be used.

In some embodiments, error amplifier 600 may be implemented without switches 602 and 604.

Figure 7:
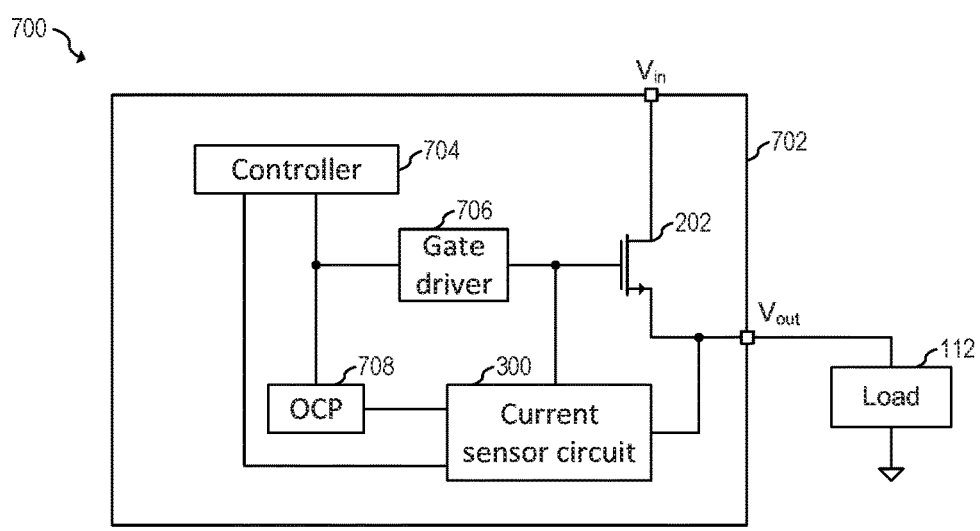
FIG. 7 shows an e-fuse circuit that includes the current sensor circuit of FIG. 3, according to an embodiment of the present invention.

FIG. 7 shows e-fuse circuit 700 that includes current sensor circuit 300, according to an embodiment of the present invention. E-fuse circuit 700 is similar to the circuit used to obtain the simulation data illustrated in FIG. 5. E-fuse circuit 700 includes current sensor circuit 300, load 112, gate driver 706, controller 704 and over-current protection circuit 708. One general aspect includes a current sense circuit including: a copy transistor of a first type having a gate terminal configured to be coupled to a gate terminal of an output transistor of the first type, and a drain terminal coupled to an input terminal, the drain terminal of the copy transistor configured to be coupled to a drain terminal of the output transistor; a first transistor of the first type having a current path coupled to a current path of the copy transistor; an error amplifier having a non-inverting input terminal coupled to a source terminal of the copy transistor, an inverting input terminal configured to be coupled to a source terminal of the output transistor, an output terminal coupled to a gate terminal of the first transistor, a positive power supply terminal coupled to the input terminal and a negative power supply terminal coupled to a reference supply terminal; and a current-to-voltage converter having an input coupled to the current path of the copy transistor.

Implementations may include one or more of the following features. The current sense circuit where the current-to-voltage converter is configured to sense a copy current flowing through the current path of the first transistor, and to generate a sense voltage based on the copy current. The current sense circuit further including the output transistor, where the gate terminal of the output transistor is coupled to the gate terminal of the copy transistor. The current sense circuit where the output transistor is a power metal-oxide-semiconductor field-effect transistor (MOSFET). The current sense circuit where the first type is the n-type. The current sense circuit further including a load coupled to the source terminal of the output transistor. The current sense circuit where the current-to-voltage converter includes: a cascode transistor having a current path coupled between the current path of the copy transistor and the current path of the first transistor; a second copy transistor having a gate terminal coupled to the gate terminal of the first transistor; a third transistor having a current path coupled to a current path of the second copy transistor; a second error amplifier having a first input terminal coupled to a source terminal of the third transistor, a second input terminal coupled to a source terminal of the cascode transistor and an output terminal coupled to a gate terminal of the third transistor; and a current mirror coupled to the third transistor. The current sense circuit where the current mirror is configured to copy a current flowing through the second copy transistor into a sense current. The current sense circuit further including a resistor coupled to the current mirror and an output voltage terminal. The current sense circuit where the resistor is configured to generate a sense voltage at the output voltage terminal based on a sense current flowing through the current mirror. The current sense circuit further including a voltage generator coupled to a gate terminal of the cascode transistor. The current sense circuit where the copy transistor and the cascode transistor are high-voltage transistors, and where the first transistor, the second copy transistor and the third transistor are low-voltage transistors. The current sense circuit where low-voltage transistors are transistors implemented with 3 V devices and where high voltage transistors are transistors implemented with 16 V devices.

Another general aspect includes a method of sensing current, the method including: providing an output current to a load with an output transistor of a first type having a drain terminal coupled to a first supply terminal, and a source terminal coupled to the load; copying the output current into a first copy current by keeping a voltage of a source terminal of a copy transistor of the first type equal to a voltage of the source terminal of the output transistor, where the copy transistor has a drain terminal coupled to the drain terminal of the output transistor and a gate terminal coupled to a gate terminal of the output transistor; copying the first copy current into a second copy current by keeping a voltage of a drain terminal of a second copy transistor equal to a voltage of a drain terminal of a first transistor of the first type, where the first transistor includes a current path coupled to a current path of the copy transistor and a gate terminal coupled to a gate terminal of the second copy transistor; copying the second copy current into a sense current; and generating a sense voltage based on the sense current.

Implementations may include one or more of the following features. The method where the first type is the n-type. The method further including: providing a first voltage to a cascode transistor having a current path coupled between the current path of the first transistor and the current path of the copy transistor. The method where copying the second copy current into the sense current includes copying the second copy current into the sense current using a current mirror coupled to a second supply terminal. The method further including: receiving 12 V at the first supply terminal; and receiving 3.3 V at the second supply terminal, where the first voltage is equal to 1.2 V.

Yet another general aspect includes an electronic fuse circuit including: a power metal-oxide-semiconductor field-effect transistor (MOSFET) of a first type having a drain terminal coupled to an input terminal and a source terminal configured to be coupled to a load; a gate driver circuit coupled to a gate terminal of the power m MOSFET; a current sensor circuit coupled to the power MOSFET; and a controller coupled to the gate driver circuit and further coupled to the current sensor circuit, where the current sensor circuit includes: a copy transistor of the first type having a gate terminal coupled to a gate terminal of the power MOSFET, and a drain terminal coupled to the input terminal and to the drain terminal of the power MOSFET; a first transistor of the first type having a current path coupled to a current path of the copy transistor; an error amplifier having a non-inverting input terminal coupled to the source terminal of the copy transistor, an inverting input terminal coupled to the source terminal of the power MOSFET, an output terminal coupled to a gate terminal of the first transistor, a positive power supply terminal coupled to the input terminal and a negative power supply terminal coupled to a reference supply terminal; and a current-to-voltage converter configured to: sense a copy current flowing through the current path of the first transistor, and generate a sense voltage based on the copy current.

Implementations may include one or more of the following features. The electronic fuse circuit where the first type is the n-type. The electronic fuse circuit further including an over-current protection circuit coupled to the current sensor circuit and to the gate driver circuit, where the over-current protection circuit is configured to clamp an output current flowing through a current path of the power MOSFET to a predetermined value. The current sense circuit where the current-to-voltage converter includes: a cascode transistor having a current path coupled between the current path of the copy transistor and the current path of the first transistor; a second copy transistor having a gate terminal coupled to the gate terminal of the first transistor; a third transistor having a current path coupled to a current path of the second copy transistor; a second error amplifier having a first input terminal coupled to a source terminal of the third transistor, a second input terminal coupled to a source terminal of the cascode transistor and an output terminal coupled to a gate terminal of the third transistor; and a current mirror configured to copy a current flowing through the second copy transistor into a sense current. The current sense circuit where the copy transistor and the cascode transistor are high-voltage transistors, and where the first transistor, the second copy transistor and the third transistor are low-voltage transistors.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A current sense circuit comprising:
a copy transistor of a first type having a control terminal configured to be coupled to a control terminal of an output transistor and a first current path terminal coupled to a first supply terminal, the first current path terminal of the copy transistor configured to be coupled to a first current path terminal of the output transistor;
a first transistor of the first type having a first current path terminal coupled to a second current path terminal of the copy transistor;
an error amplifier having a first input terminal coupled to the second current path terminal of the copy transistor, a second input terminal configured to be coupled to a second current path terminal of the output transistor, an output terminal coupled to a control terminal of the first transistor, a positive power supply terminal coupled to the first supply terminal, and a negative power supply terminal coupled to a second supply terminal; and
a current-to-voltage converter having an input coupled to the second current path terminal of the copy transistor.

2. The current sense circuit of claim 1, wherein the copy transistor and the first transistor are metal-oxide-semiconductor field-effect transistors, and wherein the first type is an n-type.

3. The current sense circuit of claim 1, wherein the first current path terminal of the copy transistor is a drain terminal, the second current path terminal of the copy transistor is a source terminal, and the first current path terminal of the first transistor is a drain terminal, the first transistor having a source terminal coupled to the second supply terminal.

4. The current sense circuit of claim 1, further comprising the output transistor having the second current path terminal configured to be coupled to a load.

5. The current sense circuit of claim 4, wherein the output transistor is a power metal-oxide-semiconductor field-effect transistor.

6. The current sense circuit of claim 4, further comprising the load.

7. The current sense circuit of claim 6, wherein the load comprises a light emitting diode (LED).

8. The current sense circuit of claim 6, wherein the load comprises a motor.

9. The current sense circuit of claim 1, wherein the error amplifier comprises a pair of p-type transistors coupled to the first supply terminal.

10. The current sense circuit of claim 1, wherein the current-to-voltage converter comprises a second error amplifier having a pair of p-type transistors coupled to the second supply terminal.

11. The current sense circuit of claim 10, wherein the first supply terminal is configured to receive a first voltage, and the second supply terminal is configured to receive a second voltage lower than the first voltage.

12. The current sense circuit of claim 1, wherein the error amplifier comprises:
a current source;
first and second high-side transistors coupled to the current source;
first and second low-side transistors respectively coupled between the first and second high-side transistors and the second supply terminal; and
a first switch having
a first input configured to receive a clock signal,
a second input configured to receive an inverted clock signal,
a first terminal coupled to the first high-side transistor and the first low-side transistor,
a second terminal coupled to the output terminal of the error amplifier,
a third terminal coupled to the second high-side transistor and the second low-side transistor, and
a fourth terminal coupled to control terminals of the first and second low-side transistors.

13. The current sense circuit of claim 12, wherein the clock signal has a frequency of 100 kHz or more.

14. A method of sensing current, the method comprising:
providing an output current to a load with an output transistor of a first type, the output transistor having a first current path terminal coupled to a first supply terminal, and a second current path terminal coupled to the load;
copying the output current into a first copy current by keeping a voltage of a first current path terminal of a copy transistor of a first type equal to a voltage of the second current path terminal of the output transistor, wherein the copy transistor has a second current path terminal coupled to the first current path terminal of the output transistor and a control terminal coupled to a control terminal of the output transistor;
adjusting a voltage of a control terminal of a first transistor of the first type with an error amplifier, the first transistor having a current path coupled to the first current path terminal of the copy transistor, the error amplifier having a first input terminal coupled to the first current path terminal of the copy transistor and a second input coupled to the second current path terminal of the output transistor; and
converting the first copy current into a sense voltage using a current-to-voltage converter having an input coupled to the first current path terminal of the copy transistor.

15. The method of claim 14, further comprising copying the first copy current into a second copy current by keeping a voltage of a first current path terminal of a second copy transistor equal to a voltage of a first current path terminal of the first transistor, wherein converting the first copy current into the sense voltage comprises:
copying the second copy current into a sense current; and
generating the sense voltage based on the sense current.

16. The method of claim 14, further comprising:
providing a first voltage to a cascode transistor having a current path coupled between the current path of the first transistor and the first current path terminal of the copy transistor; and
adjusting a voltage of a control terminal of a second transistor of the first type with a second error amplifier to generate a second copy current flowing through the current path of the second transistor based on a voltage at the first current path terminal of the copy transistor and a voltage at a first current path terminal of the second transistor.

17. The method of claim 16, further comprising performing a chopping technique with the second error amplifier.

18. The method of claim 14, further comprising performing a chopping technique with the error amplifier.

19. An electronic circuit comprising:
a power transistor of a first type having a first current path terminal coupled to a first supply terminal and a second current path terminal configured to be coupled to a load;
a driver circuit coupled to a gate terminal of the power transistor; and
a current sensor circuit coupled to the power transistor, wherein the current sensor circuit comprises:
a copy transistor of the first type having a control terminal coupled to the control terminal of the power transistor and a first current path terminal coupled to the first supply terminal;
a first transistor of the first type having a first current path terminal coupled to a second current path terminal of the copy transistor;
an error amplifier having a first input terminal coupled to the second current path terminal of the copy transistor, a second input terminal coupled to the second current path terminal of the power transistor, an output terminal coupled to a control terminal of the first transistor, a positive power supply terminal coupled to the first supply terminal, and a negative power supply terminal coupled to a reference supply terminal; and
a current-to-voltage converter having an input coupled to the second current path terminal of the copy transistor.

20. The electronic circuit of claim 19, further comprising an over-current protection circuit coupled to the current sensor circuit and to the driver circuit.

21. The electronic circuit of claim 19, wherein the current sensor circuit is configured to track an output current flowing through the power transistor during a startup phase.

22. The electronic circuit of claim 21, wherein the current sensor circuit is configured to track the output current flowing through the power transistor during the startup phase with an error that is equal to or lower than 2.47%.

* * * * *